United States Patent [19]
Azuma et al.

[11] Patent Number: 4,888,631
[45] Date of Patent: Dec. 19, 1989

[54] SEMICONDUCTOR DYNAMIC MEMORY DEVICE

[75] Inventors: Daisuke Azuma; Yoshiji Ohta; Shinichi Tanaka, all of Nara, Japan

[73] Assignee: Sharp Kabushiki Kaisha, Osaka, Japan

[21] Appl. No.: 267,679

[22] Filed: Nov. 3, 1988

Related U.S. Application Data

[63] Continuation of Ser. No. 1,953, Jan. 8, 1987, abandoned.

[30] Foreign Application Priority Data

Jan. 17, 1986 [JP] Japan .................................. 61-8575
Jan. 17, 1986 [JP] Japan .................................. 61-8576
Jan. 21, 1986 [JP] Japan .................................. 61-11542
Feb. 5, 1986 [JP] Japan .................................. 61-24577

[51] Int. Cl.$^4$ ........................ H01L 27/10; G11C 11/40
[52] U.S. Cl. .................................. 357/23.6; 357/23.7; 357/51; 365/149
[58] Field of Search .................. 357/23.6, 23.7, 4, 49, 357/41, 51; 365/149

[56] References Cited

U.S. PATENT DOCUMENTS 4,485,459 11/1984 Vehkateswaran .................. 365/200
4,489,478 12/1984 Sakurai .............................. 357/23.7

OTHER PUBLICATIONS

Sturm et al., IEEE Electron Device Letters, vol. EDL5, No. 5, May 1984, pp. 151–153.
Akiyama et al., IEEE International Electron Device Meeting, Dec. 3, 1983, Technical Digest, pp. 352–355.

*Primary Examiner*—William D. Larkins
*Attorney, Agent, or Firm*—Flehr, Hohbach, Test, Albritton & Herbert

[57] ABSTRACT

A semiconductor IC element is three-dimensionally structured with a first active layer formed on a single crystalline silicon substrate and a second active layer formed by melting polycrystalline silicon by irradiation on an insulative layer which electrically insulates it from the first layer. Each active layer is comprised of single crystalline areas where transistors may be formed and separation areas which insulate them. PMOS, NMOS or CMOS field effective transistors are formed on these active element areas. A test circuit for testing the originally intended functions of the element as well as its redundant circuits may be formed on these layers. Throughholes are provided to connect the vertically separated active layers.

5 Claims, 11 Drawing Sheets

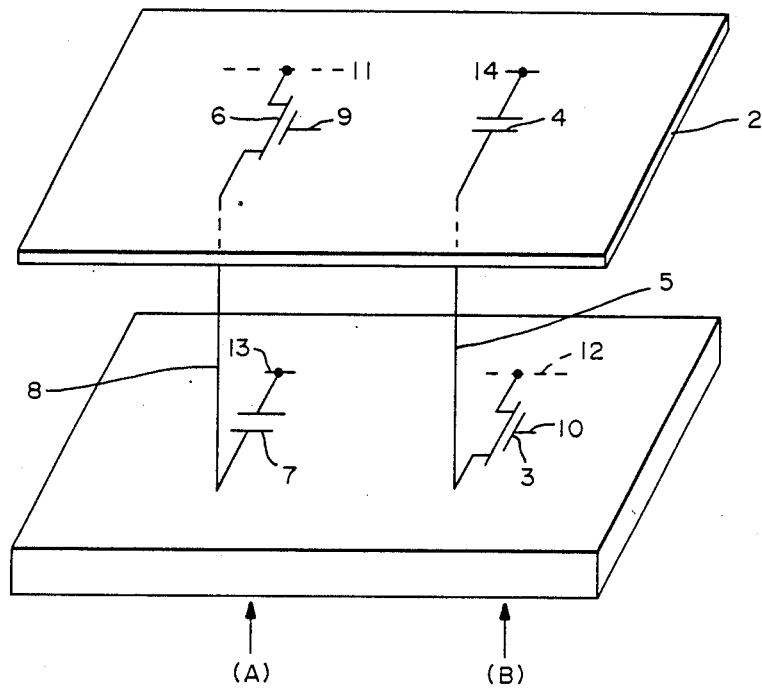
FIG.—1
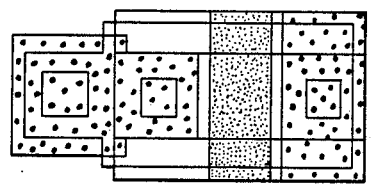
FIG.—2A
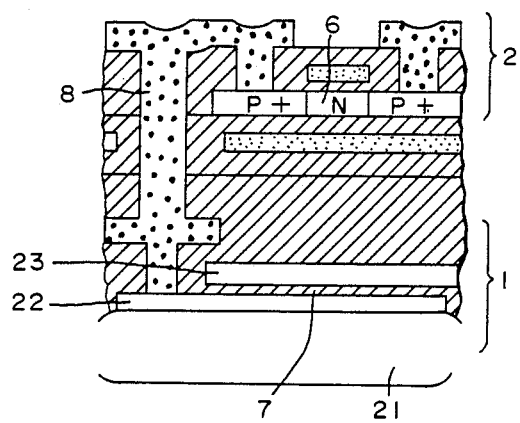
FIG.—2B

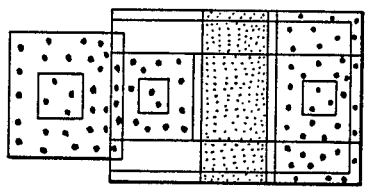
FIG.—3A
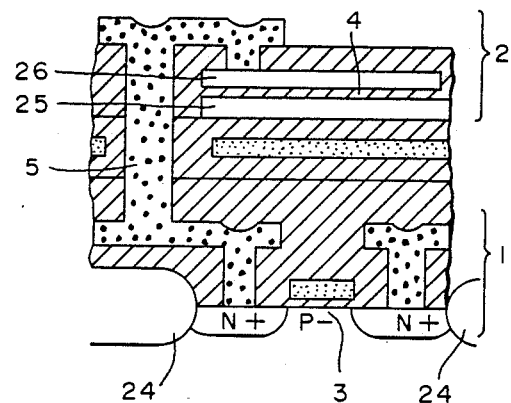
FIG.—3B
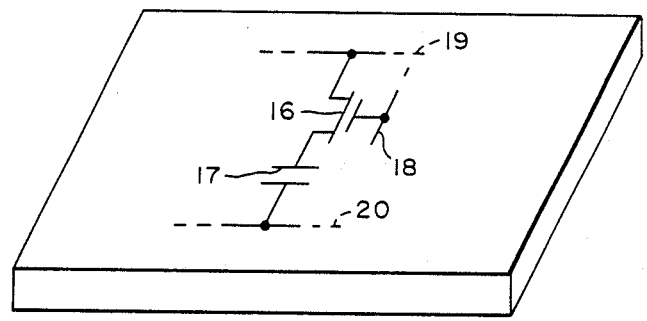
(PRIOR ART)
FIG.—5

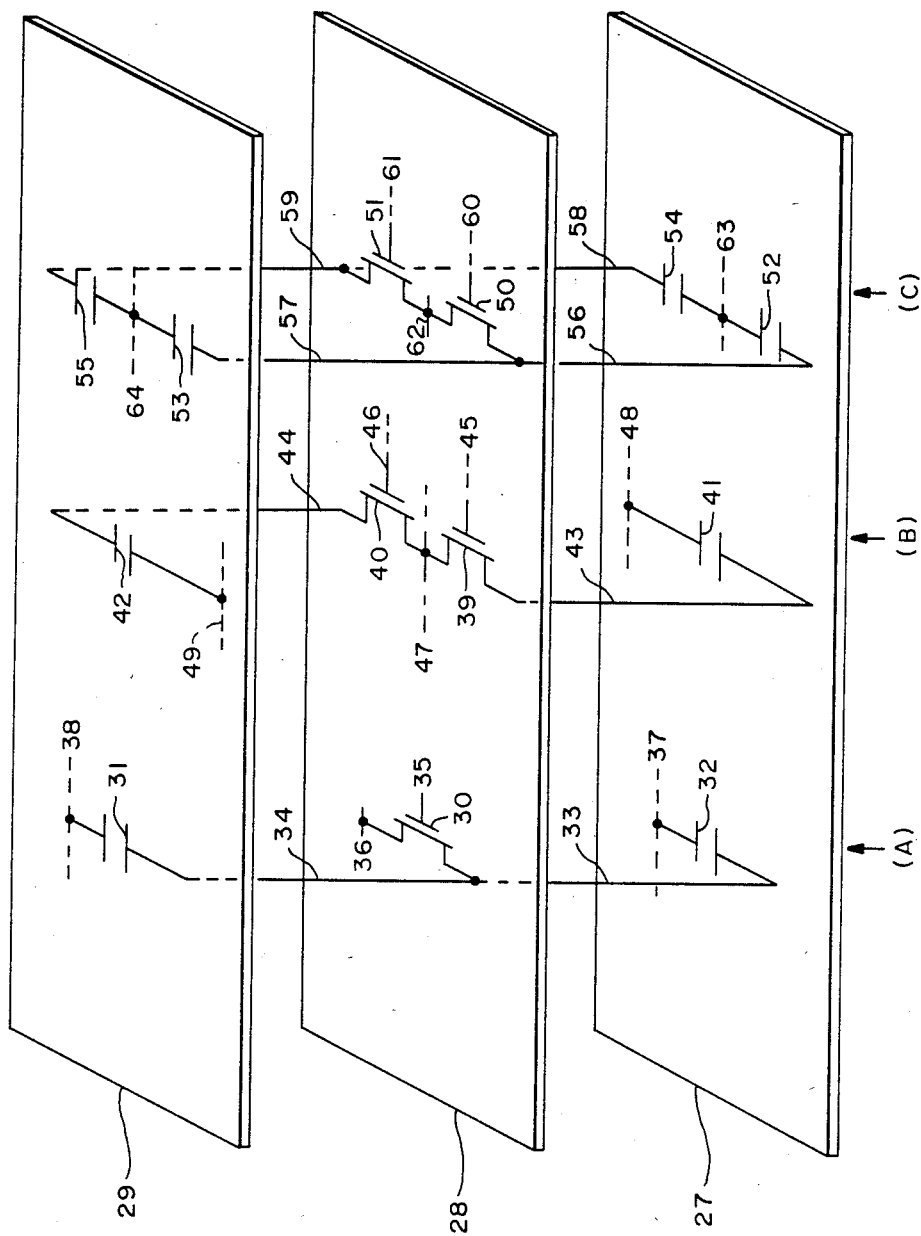
FIG.—4

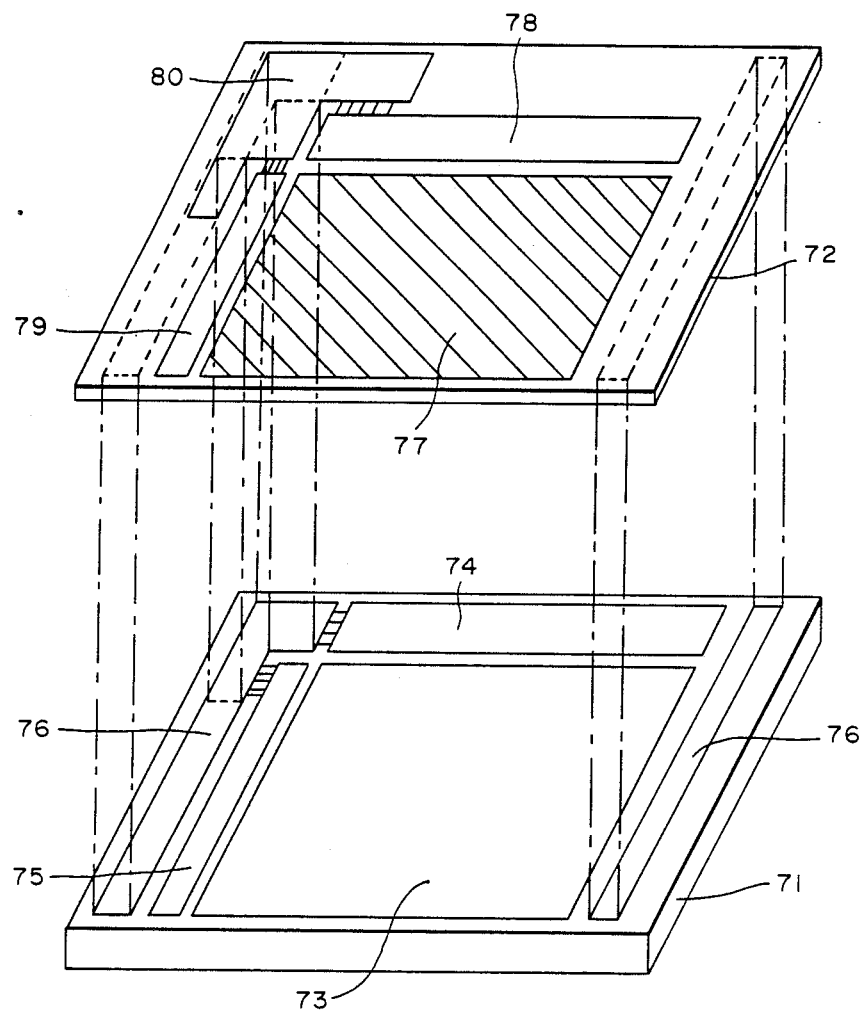
FIG.—6
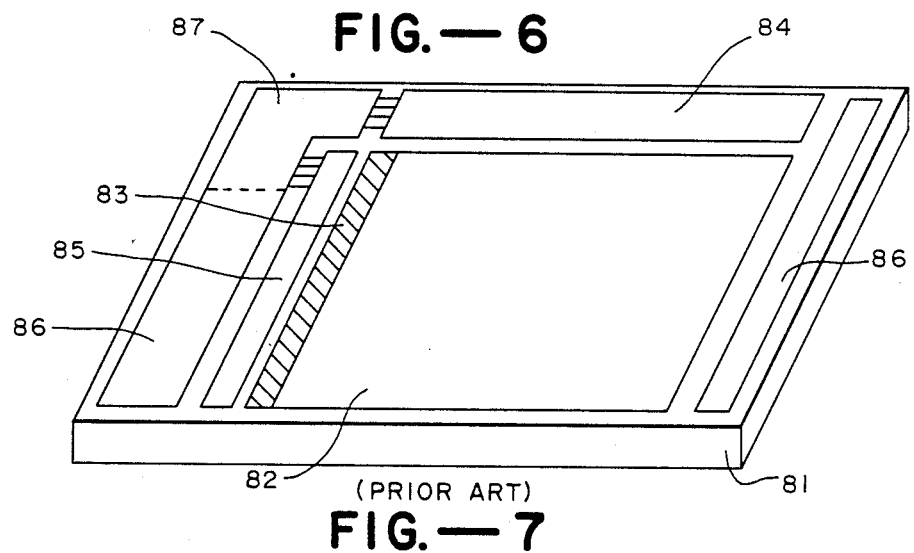
(PRIOR ART)
FIG.—7

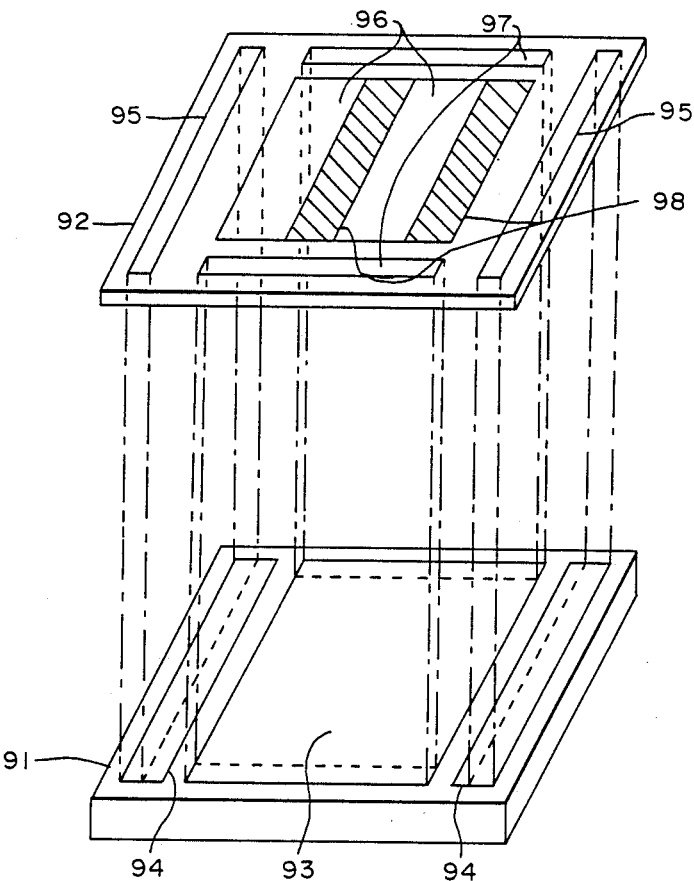
FIG.—8
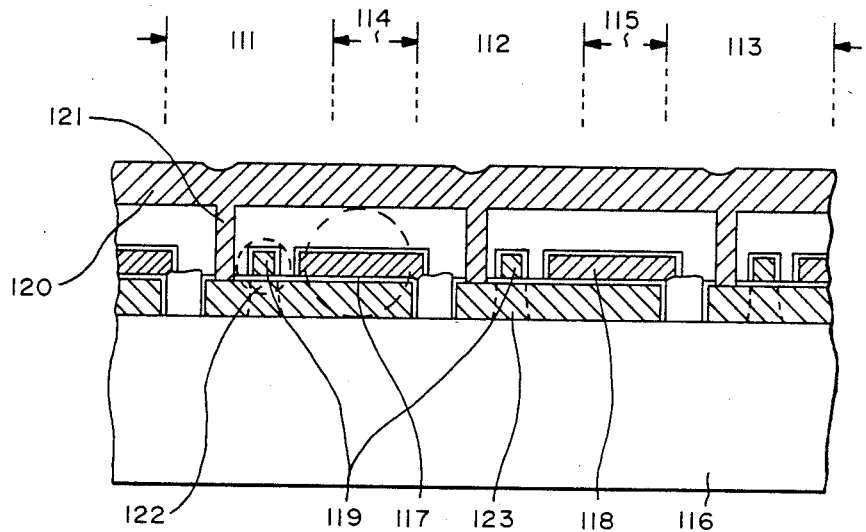
FIG.—10B

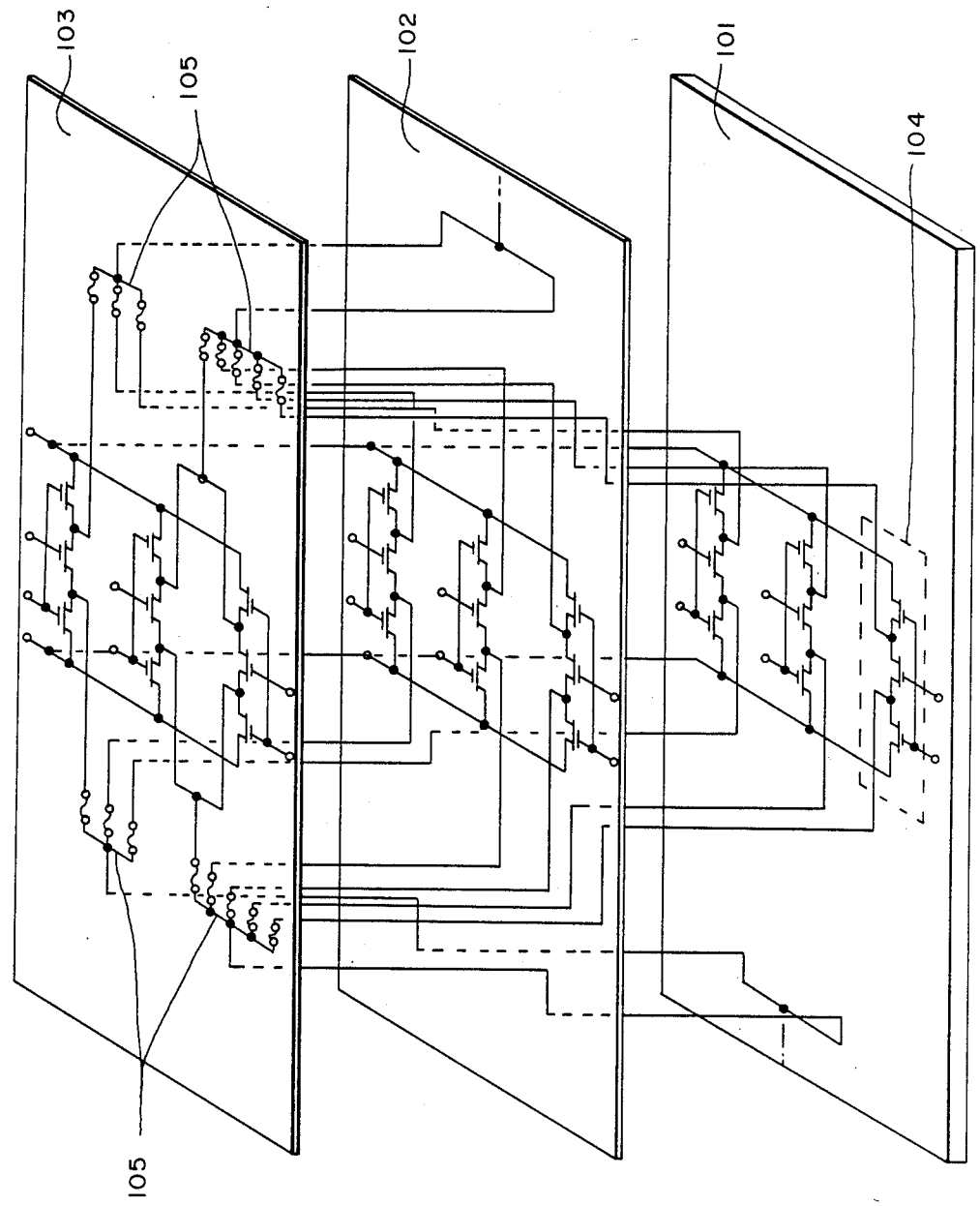
FIG.—9

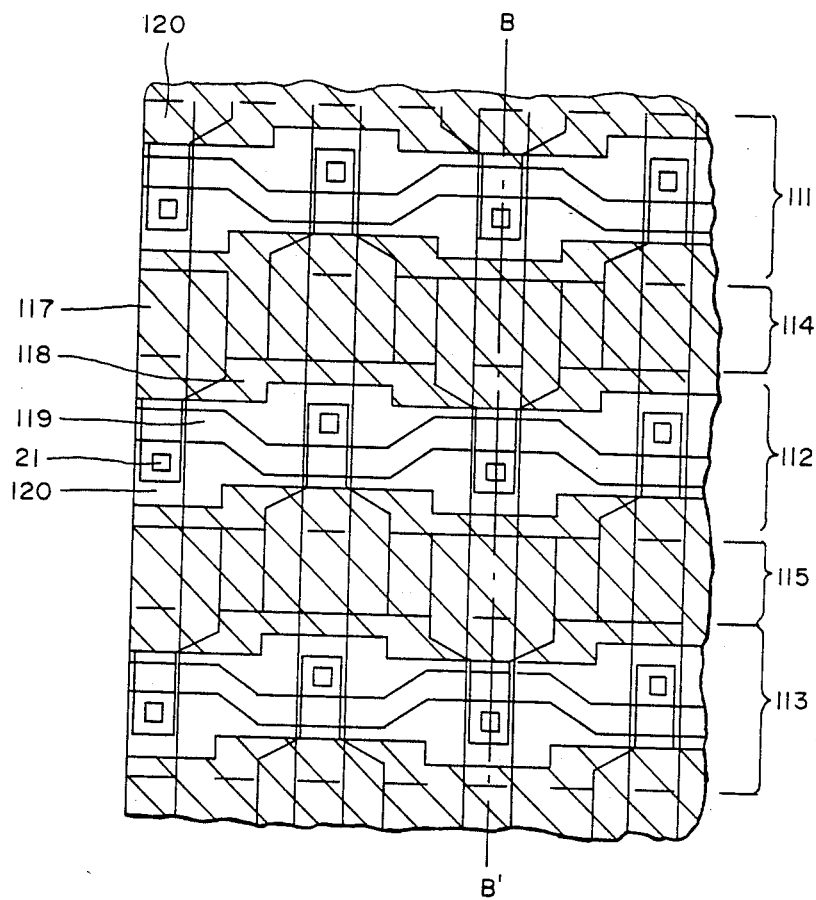
FIG.—10A

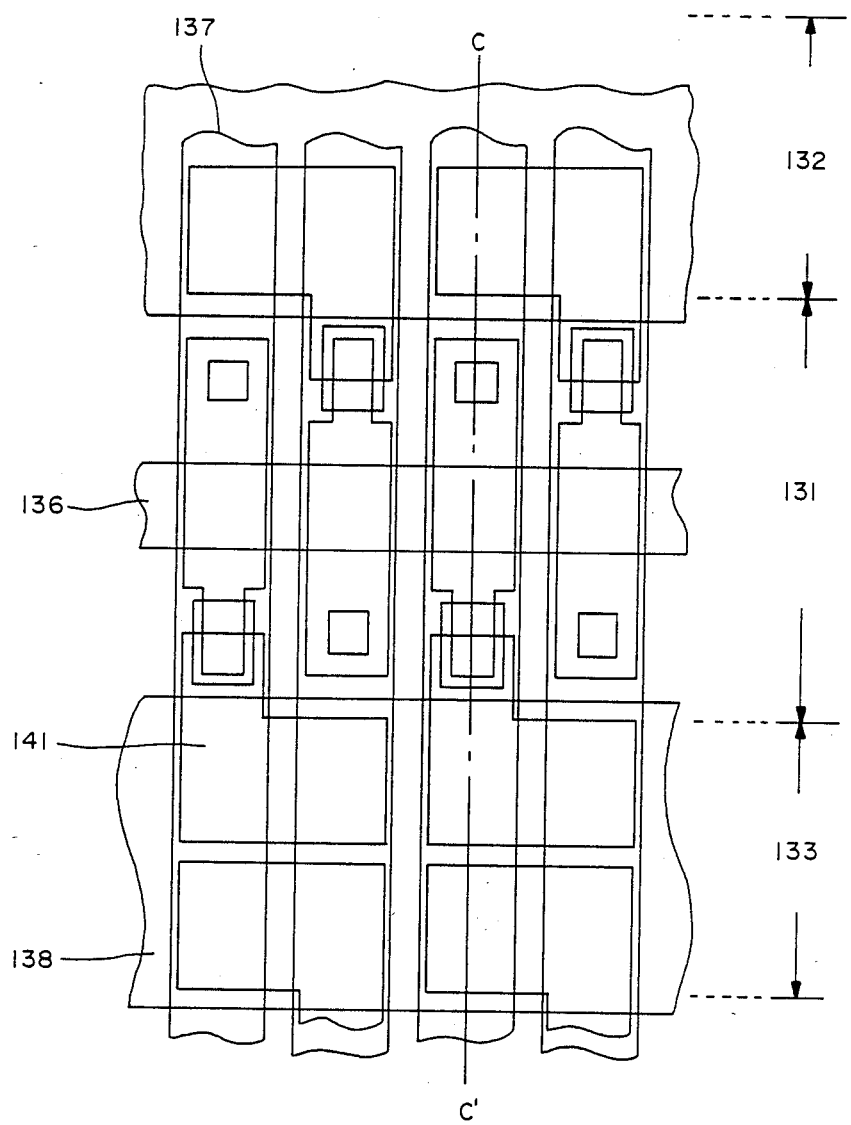
FIG.—11A

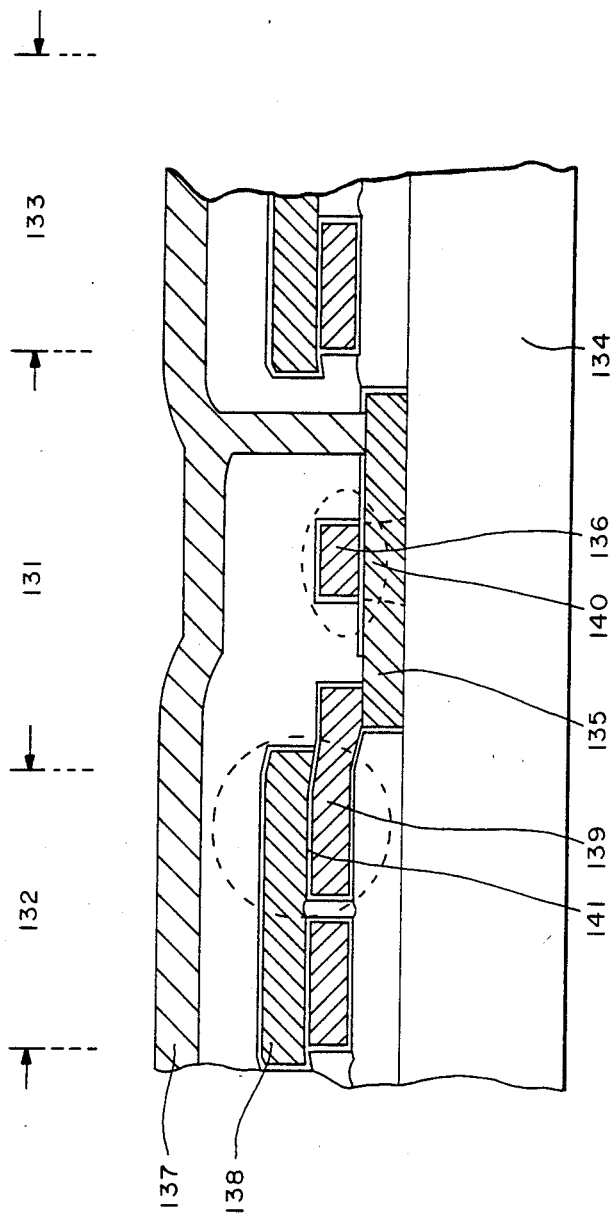
FIG.—11B

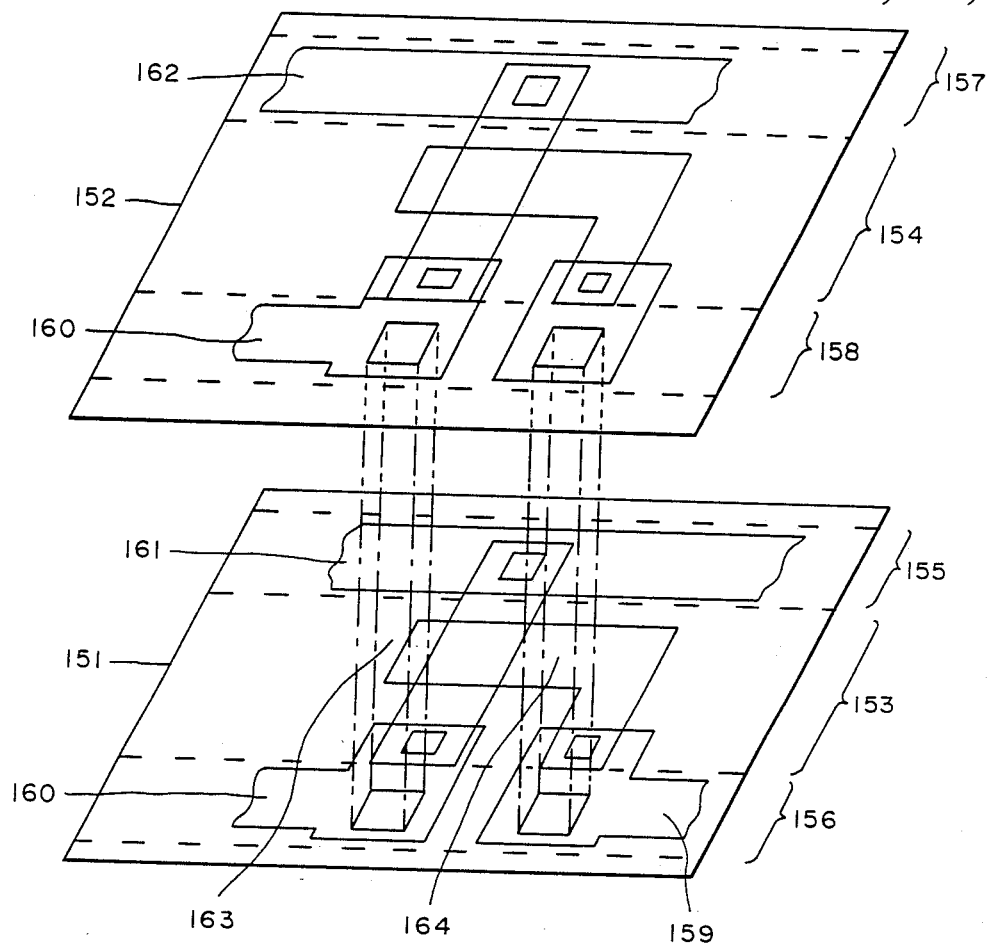
FIG.—12A
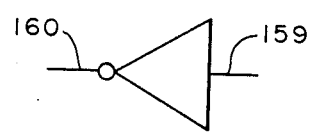
FIG.—12B

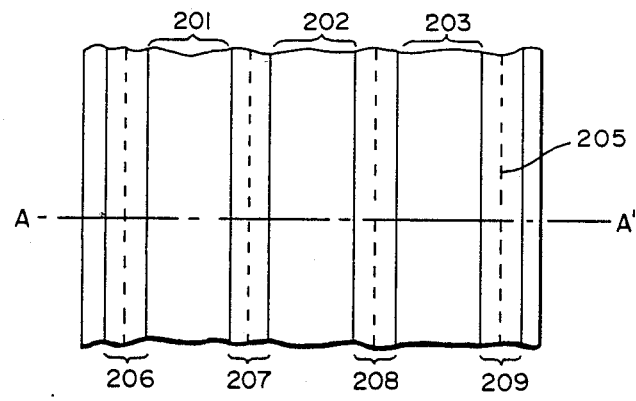
FIG.—13A
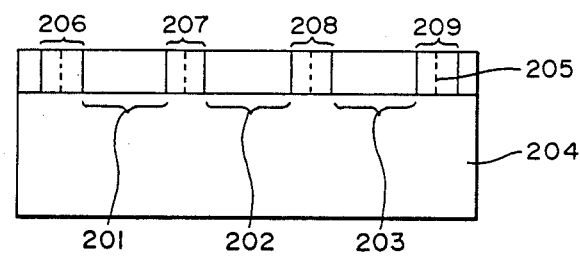
FIG.—13B
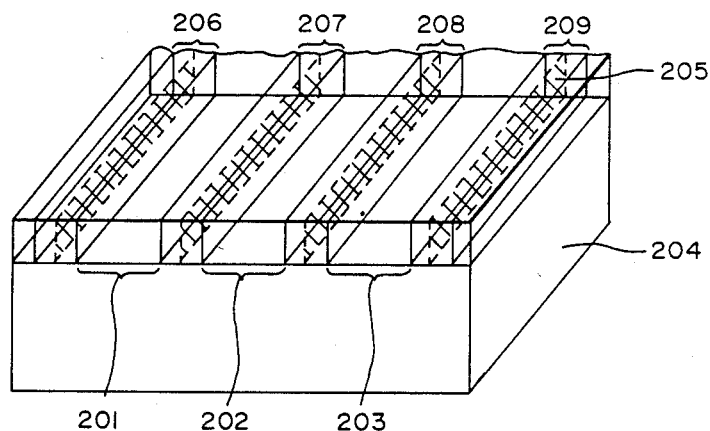
FIG.—13C

SEMICONDUCTOR DYNAMIC MEMORY DEVICE

This is a continuation of application Ser. No. 001,953, filed Jan. 8, 1987, now abandoned.

BACKGROUND OF THE INVENTION

This invention relates to a semiconductor integrated circuit (IC) element having three-dimensionally stacked active layers and more particularly to such an element with improved reliability and degree of integration, having throughholes for efficient wiring and miniaturized areas with simplified design. The present invention further relates to a semiconductor IC element including a test circuit in redundant structure such that the functions originally intended for the element can be tested reliably.

With the recent progress in miniaturization technologies, many kinds of semiconductor memory circuit elements such as dynamic random-access memories are becoming highly integrated. Memory cells which occupy most of the areas of semiconductor IC elements of a dynamic random-access memory are now of a one-transistor one-capacitor structure and such memory cells are also becoming smaller. With the miniaturization of such memory cells, many ideas have been proposed to keep the capacitance of cell capacitors reasonably large. Grooved and stacked capacitors have thus been considered in order to increase the effective area of a cell capacitor. Since the capacitance of a cell capacitor for each memory cell must be maintained at a certain level, the degree of integration can be increased only if the element area can be increased accordingly so long as the same miniaturization technology is employed.

Another problem to be considered relates to the production yield which tends to go down as the degree of integration is increased, thus adversely affecting the reliability of the products. As a countermeasure to this problem, use of redundant circuits has been considered. In the case of a semiconductor memory element, for example, spare memory cells and decoders have been incorporated as redundant circuits in order to improve the yield. Because of the space limitation, however, such redundant circuits cannot be incorporated freely. Moreover, redundant circuits which are manufactured by the same process used for the original circuit are equally likely to be defective. In other words, efficacy of redundant circuits are determined by their number and their individual reliability, but since only a limited number of redundant circuits can be used because of the aforementioned space limitation, there is also a limit to the improvement in the yield.

A still further problem related to such elements is the testing of their operational functions. Such function tests are carried out on produced elements, for example, for the development of new products. Recently, semiconductor IC elements with a simple function test circuit have been considered in order to reduce the time required for such testing. If such a test circuit itself is defective, however, the user would consider an otherwise acceptable product to be defective, or not testable. In such a situation, the product will have to be directly tested by some other means. If such defects are frequent, the test circuits which were incorporated for the purpose of reducing the testing time lose their reason for existence. Moreover, since the available area on each element is limited as mentioned above, it is not practical to incorporate a test circuit which is large enough to be able to test too many functions of the element. In short, the time required for testing cannot be reduced significantly.

A still another problem to be considered relates to the technology of forming a recrystallized active area by melting polycrystalline silicon by irradiation. At the present time, it is not possible to form the entire surface of an element as a uniformly oriented recrystallized active area like a single crystalline silicon substrate. As shown in FIGS. 13A, 13B and 13C, crystalline granular interfaces are inevitably formed where single crystalline areas with different surface orientations join together. FIGS. 13A, 13B and 13C show conceptually an active layer of SOI (silicon on insulator) structure grown by melting polycrystalline silicon by irradiation on an insulative layer. FIG. 13A is its plan view, FIG. 13B is its sectional view taken along the line A-A' of FIG. 13A and FIG. 13C is its perspective view. In these figures, numerals 201, 202 and 203 are recrystallized areas where transistors can be formed (hereinafter referred to as active element areas) and numeral 204 indicates an insulative layer. When the areas 201, 202 and 203 are formed by melting polycrystalline silicon by irradiation, the silicon begins to harden from the center of the irradiating beam and hence the surface orientations are not necessarily uniform. As a result, crystalline granular interfaces 205 are formed. Numerals 206, 207, 208 and 209 indicate areas where crystalline granular interfaces are expected to be present. It is not desirable to place channels of MOS transistors and the like in such an area. Although they should ideally be placed in recrystallized active element areas, this causes to limit the areas where transistors can be disposed and hence the degree of integration.

SUMMARY OF THE INVENTION

It is an object of the present invention to provide a semiconductor memory element using three-dimensionally structured SOI memory cells with reduced cell areas compared to the conventional two-dimensionally structured dynamic random access memory (RAM) cells while maintaining the capacitance of memory cell capacitors such that the number of memory cells can be substantially increased.

It is another object of the present invention to provide a semiconductor IC element on which highly reliable redundant circuits can be added.

It is still another object of the present invention to provide a semiconductor IC element incorporating a test circuit for testing the functions originally intended for the element and redundant circuits for the test circuit to improve the reliability of the testing.

It is a further object of the present invention to provide a semiconductor IC element of high quality with reduced leak current, making effective use of inactive areas of its SOI structure by positioning the channel areas of MOS transistors in recrystallized active areas and utilizing inactive areas effectively.

The above and other objects of the present invention are achieved by providing a three-dimensionally stacked semiconductor element with a first active layer formed on a single crystalline silicon substrate and a second active layer formed by melting polycrystalline silicon by irradiation above an insulative layer serving to insulate it from the first active layer, each active layer being comprised of single crystalline active element areas of desired widths and separating areas which serve to insulate these active element areas with desired intervals. These single crystalline active element areas are made of PMOS, NMOS or CMOS field effect transistors such that the known MOS technologies can be utilized. Throughholes may be provided to connect the active layers vertically such that the conventional miniaturization technologies can be used to provide more highly integrated semiconductor circuit elements than the conventional dynamic RAMs.

When a plurality of active layers with SOI structure are built on a conventional two-dimensional semiconductor IC on a crystalline silicon as described above, highly redundant circuits may be added on these layers without being limited by the area of the element. Alternatively, reliable test circuits for testing the element's functions as well as their redundant circuits may be added. Only the area for fuses or control signal lines for separating the original functions of the element from defective sections will be required.

In another aspect, the present invention provides a semiconductor IC element with a first active layer formed on a single crystalline silicon substrate and a second active layer of SOI structure formed above an insulative layer which insulates it electrically from the first active layer, each active layer being formed with recrystallized active element areas having desired widths, inactive areas and separation areas which insulate these areas by providing desired intervals, these recrystallized active element areas being formed with PMOS, NMOS and CMOS field effect transistors, other areas being formed with passive elements and the like, and throughholes being provided to vertically connect these active layers.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 1 is a conceptual diagram of a dynamic RAM cell three-dimensionally structured according to the present invention with two active layers on which transistors and capacitors are formed, FIGS. 2A and 2B are respectively a mask pattern for and a sectional view of a dynamic RAM cell three-dimensionally structured according to one embodiment of the present invention, FIGS. 3A and 3B are respectively a mask pattern for and a sectional view of a dynamic RAM cell three-dimensionally dimensionally structured according to another embodiment of the present invention, FIG. 4 is a conceptual diagram of another memory cell embodying the present invention, FIG. 5 is a conceptual diagram of a conventional dynamic RAM cell formed on a single active layer on a two-dimensional single crystalline silicon substrate, FIG. 6 is a conceptual diagram of a semiconductor IC element three-dimensionally structured according to the present invention with two active layers, inclusive of redundant circuits, FIG. 7 is a conceptual diagram of a conventional semiconductor memory element two-dimensionally structured on a single crystalline silicon substrate, FIG. 8 is a conceptual diagram of a semiconductor IC element three-dimensionally structured according to another embodiment of the present invention with two active layers, inclusive of test circuits, FIG. 9 is a circuit diagram according to the present invention of a test circuit and a portion of its redundant circuits, FIGS. 10A and 10B are respectively a mask pattern of a memory cell array with dynamic semiconductor memory elements formed on an active layer of SOI structure and its sectional view taken along the line B-B' of FIG. 10A, FIGS. 11A and 11B are respectively another mask pattern of a memory cell array embodying the present invention with dynamic semiconductor memory elements formed on an active layer of SOI structure and its sectional view taken along the line C-C' of FIG. 11A, FIGS. 12A and 12B are respectively a conceptual diagram of a mask pattern of a three-dimensionally structured element with stacked active layers of SOI structure and its logical diagram, and FIGS. 13A, 13B and 13C are respectively a plan view, a sectional view taken along the line A-A' of FIG. 13A and a perspective view of the generation of crystalline granular interfaces in an active layer of SOI structure formed by melting polycrystalline silicon by irradiation.

DETAILED DESCRIPTION OF THE INVENTION

With reference to FIG. 1 which is a conceptual diagram of a memory cell of a dynamic RAM with two active SOI layers, numeral 1 indicates a first single active layer formed on a single crystalline silicon substrate and numeral 2 indicates a second single active layer obtained by melting polycrystalline silicon by irradiation above an insulative layer (not shown) which insulates it electrically from the first active layer 1. MOS transistors of the same channel such as PMOS and NMOS are formed on these active layers. For example, an NMOS transistor may be formed on the first active layer 1 and a PMOS transistor on the second active layer 2. With reference still to FIG. 1, a three-dimensional memory cell may be formed (as indicated by (B)) with a throughhole 5 connecting an NMOS transistor 3 on the first active layer 1 and a cell capacitor 4 on the second active layer 2 or (as indicated by (A)) with a throughhole 8 connecting a PMOS transistor 6 on the second active layer 2 and a cell capacitor 7 on the first active layer 1. Numerals 9 and 10 indicate word lines, numerals 11 and 12 indicate bit lines and numerals 13 and 14 indicate cell plates. It is to be noted that these memory cells have the same functions as the conventional type of memory cells shown in FIG. 5 wherein numerals 15 through 20 respectively indicate a single crystalline silicon substrate, a MOS transistor, a cell capacitor, a word line, a bit line and a cell plate.

FIGS. 2 and 3 show mask patterns and sectional structures of three-dimensionally structured memory cells illustrated by FIG. 1. FIGS. 2A and 3A show mask patterns and FIGS. 2B and 3B show sectional structures.

FIGS. 2A and 2B relate to the cell (A) of FIG. 1 with the PMOS transistor 6 on the second active layer 2 of SOI structure and the cell capacitor 7 on the layer therebelow, that is, the first active layer 1. Numeral 21 indicates a field oxide layer. Although the cell capacitor 7 is shown in FIG. 2B to include two polysilicon layers 22 and 23, this may be replaced by a conventional type of capacitor such as one formed with a single crystalline silicon and polysilicon, a capacitor with two metal layers, a grooved capacitor or a stacked capacitor. Although the throughhole 8 is shown in FIG. 2 to be connected to the cell capacitor 7 on the first active layer 1 through the first polysilicon layer 22, it is equally acceptable if the throughhole 8 is connected to the second polysilicon layer 23 and the first polysilicon layer 22 is made to function as the cell plate.

FIGS. 3A and 3B relate to the cell (B) of FIG. 1 with the NMOS transistor 3 on the first active layer 1 and the cell capacitor 4 on the layer thereabove, that is, the second active layer 2. Numeral 24 indicates a field oxide layer. Although the cell capacitor 4 is shown herein to include two polysilicon layers 25 and 26, this may be replaced by a conventional type of capacitor such as one of SOI structure with single crystalline silicon and polysilicon, one with two metal layers or a capacitor of stacked type. Although the throughhole 5 of FIG. 3 is shown to be connected to the cell capacitor 4 on the second active layer 2 through the second polysilicon layer 26, it is equally acceptable if the throughhole 5 is connected to the first polysilicon layer 25 and the second polysilicon layer 26 is made to function as the cell plate.

Memory cells according to another embodiment of the present invention are conceptually illustrated in FIG. 4 wherein numeral 27 indicates a first active layer formed on a single crystalline silicon substrate, numeral 28 is a second active layer grown by melting polycrystalline silicon by irradiation on an insulative layer (not shown) which electrically insulates it from the first active layer 27, and numeral 29 is a third active layer grown by melting polycrystalline silicon by irradiation on another insulative layer (not shown) which electrically insulates it from the second active layer 28. Three memory cells (A), (B) and (C) are conceptually illustrated in FIG. 4. The first (A) is obtained by forming a MOS transistor 30 on the second active layer 28 and cell capacitors 31 and 32 on the first and second active layers 27 and 29, respectively, and connecting the first and second active layers 27 and 28 by a first throughhole 33 and the second and third active layers 28 and 29 by a second throughhole 34. Numerals 35 and 36 indicate respectively a word line and a bit line. Numerals 37 and 38 are cell plates. In summary, this memory cell (A) is spread over three active layers and two capacitors provide capacitance of this single memory cell.

Similarly, the second cell (B) of FIG. 4 with increased degree of integration is obtained by forming two MOS transistors 39 and 40 on the second active layer 28 and cell capacitors 41 and 42 respectively on the first and third active layers 27 and 29. Numerals 43 and 44 indicate throughholes, numerals 45 and 46 indicate word lines, numeral 47 indicates a bit line, and numerals 48 and 49 indicate cell plates. The third cell (C) of FIG. 4 with increased density and degree of integration includes MOS transistors 50 and 51 on the second active layer 28, cell capacitors 52, 53, 54 and 55 and throughholes 56, 57, 58 and 59, as shown. Numerals 60 and 61 indicate word lines, numeral 62 indicates a bit line and numerals 63 and 64 indicate cell plates. It goes without saying that all memory cells of FIG. 4 have the same functions as a conventional memory cell.

In summary, three-dimensionally structured semiconductor IC elements as disclosed above include a first active layer formed on a single crystalline silicon substrate and a second active layer grown by melting polycrystalline silicon by irradiation on an insulative layer which electrically insulates it from the first active layer. Each active layer is comprised of single crystalline active element areas of desired widths and separation areas which insulate them with desired intervals. Since the transistor part and the cell capacitor part of a dynamic semiconductor memory cell are thus dispersed, the cell size can be reduced without decreasing the capacitance of the cell capacitor. Throughholes serve to reduce problems related to wiring such that the area of the element can be reduced and its speed can be improved. If PMOS transistors are used, furthermore, circuits for boosting word lines become unnecessary in the surroundings and reduction of area can be effected also with respect to peripheral circuits. Moreover, since the delay associated with the boosting of word lines is eliminated, the element speed can be greater than if NMOS transistors are used.

FIG. 6 is a conceptual diagram of a semiconductor memory such as a dynamic or static RAM with a redundant circuit section according to the present invention embodied with two active layers of SOI structure. MOS transistors such as PMOS, NMOS and CMOS transistors are formed both on a first active layer 71 and a second active layer 72. The first active layer 71 is formed on a single crystalline silicon substrate and a second active layer 72 is formed by melting polycrystalline silicon by irradiation on an insulative layer (not shown) which electrically insulates it from the first active layer 71. Throughholes (not shown) are provided, wherever necessary, to connect the two active layers 71 and 72. The first active layer 71 is characterized as containing only a memory cell array 73 providing the memory capacity originally intended for the element, decoders (both a line decoder 74 and a column decoder 75) and peripheral circuits 76 which include fuses or control signal lines for separating defective memory cells and decoders. In other words, redundant memory cells and decoders are not to be contained in the first active layer 71. By contrast, the second active layer 72 is characterized as including only redundant circuits, that is, a redundant memory cell array 77, redundant decoders (both a redundant line decoder 78 and a redundant column decoder 79), a control signal generation circuit for redundant circuits and a control section 80 for the redundant circuits inclusive of fuses.

If the element is subjected to tests for examining its functions and a defect is found in a bit line, a word line, a decoder or a memory cell, its address is detected and either a fuse is cut off or the control section 80 generates a control signal such that the decoder or the memory cell at the detected address will be prevented from being selected and the control section 80 simultaneously operates such that a redundant decoder or memory cell will be selected instead at the address where the defect was detected. Redundant throughholes (not shown) are also provided for inter-layer connection. In the case of a failure in a throughhole connecting the active layers, a fuse may be cut off in such a way that the defective throughhole will not affect the remaining circuits.

FIG. 7 is a conceptual diagram of a two-dimensionally constructed conventional semiconductor memory element formed on a single crystalline silicon substrate including redundant circuits. Numerals 82, 83, 84, 85, 86 and 87 respectively indicate a memory cell array, a redundant memory cell array, a line decoder, a column decoder, peripheral circuits and a control section for the redundant circuits. It goes without saying that the semiconductor memory cell of FIG. 6 has the same functions as the conventional memory of FIG. 7. In addition, it is clear that the three-dimensionally structured memory element of the present invention can incorporate as many redundant circuits as appropriate without increasing the area of the element itself. In summary, the present invention makes it possible to produce highly reliable semiconductor IC elements with an increased yield.

A test circuit can be more effectively incorporated according to the present invention in a semiconductor IC element for testing its functions according to the present invention. FIG. 8 is a conceptual diagram of a semiconductor IC element three-dimensionally structured with two active layers 91 and 92 as well as throughholes (not shown) connecting them, formed similarly to the element shown in FIG. 6. According to this embodiment of the present invention, the first active layer 91 is characterized as containing only a functional circuit section 93 which has the functions originally intended for the element, its input/output section 94 and input/output lines integrating with test circuits 96 for testing the element, and the second active layer 92 contains terminals 95 for the input/output signal lines for the element, the aforementioned test circuits 96, an input/output section 97 for the test circuits 96 and redundant test circuits 98. The advantage of disposing the test circuits on the second active layer 92 is that a sufficient area can be allocated to it such that even a circuit capable of testing all the functions of the element can be accommodated. Since redundant circuits can also be included, tests can be carried out with high reliability.

FIG. 9 is a circuit diagram of a test circuit with redundancy formed with three active layers 101, 102 and 103 according to another embodiment of the present invention. This circuit represents a portion of a test circuit for effecting capacitance division to measure the cell capacitance of a dynamic semiconductor memory element and a circuit with the functions of a dynamic semiconductor memory element (not shown) is formed on each of the active layers 101, 102 and 103. The three active layers 101, 102 and 103 are formed as explained in connection with FIG. 4, the first active layer 101 being formed on a single crystalline silicon substrate, the second active layer 102 being formed by melting polycrystalline silicon by irradiation on an insulative layer (not shown) which electrically insulates it from the first active layer 101, the third active layer 103 of SOI structure being similarly formed above the second active layer 102, and throughholes (not shown) being provided between the first and second active layers 101 and 102 and also between the second and third active layers 102 and 103.

The circuit diagram of FIG. 9 is different from the conceptual diagram of FIG. 8 in that not only the first active layer 101 but also both the second and third active layers 102 and 103 have the original functions of the element and that each active layer includes redundant circuits. It is to be noted in FIG. 9 that three test circuits (one of them being enclosed by a broken line and indicated by the numeral 104) each including three transistors are arranged in parallel on each of the three active layers 101, 102 and 103. In other words, as many as nine test circuits are provided altogether, one of them serving as the "original" test circuit and the remaining eight serving as redundant circuits which serve to make the testing highly reliable. When one of the transistors in a test circuit fails or connection fails because of a defective throughhole, one of the fuses 105 on the third active layer 103 is cut off to separate the defective circuit. On the second and third active layers 102 and 103 of SOI structure obtained by melting polycrystalline silicon by irradiation on an insulative layer, the three sets of transistors may preferably be formed individually on separate single crystalline areas as will be explained more in detail below such that the test circuits are dispersed and the test reliability can be improved.

The test circuit of FIG. 9 with redundancy structure fails under the following conditions:

(i) all throughholes connecting different active layers are defective;

(ii) at least one of the three transistors in all of the nine test circuits is defective; and (iii) there is a short circuit between the gate and the source, between the gate and drain or between the source and the drain of at least one of the three transistors in all of the nine test circuits.

The conditions (ii) d (iii) mean that all of the nine provided test circuits are defective. In other words, the circuit of FIG. 9 can continue to function normally with a high probability unless there is a short circuit between a throughhole and one of wiring sections between the active layers.

With a semiconductor IC element thus structured, test circuits for the element can be added without increasing the area of the element and the test circuits thus added need not be of simple structure but may be of a sufficiently large scale. Moreover, the test circuit may be accompanied by redundant circuits such that highly reliable tests can be carried out. In the case of a high-capacity multifunctional semiconductor IC element with a plurality of active layers stacked together, in particular, reliability of the tests can be increased significantly and the time required for the testing can be substantially reduced.

A further aspect of the present invention is explained next by way of FIG. 10A which is a mask pattern of a memory element embodying the present invention and FIG. 10B which is its sectional structure, showing a memory cell array of a dynamic semiconductor memory element of SOI structure. With reference to both FIGS. 10A and 10B, numerals 111, 112 and 113 indicate recrystallized active element areas as described above, numerals 114 and 115 indicate inactive areas, numeral 116 indicates an insulative layer, numeral 117 indicates a memory capacitor, numeral 118 indicates a single polysilicon layer serving as cell plate, numeral 119 indicates a double layer polysilicon gate serving as word line, numeral 120 indicates a metallic bit line and numeral 121 indicates a contact piece. As better shown in FIG. 10B, single crystalline silicon 123 and double layer gate polysilicon 119 form a MOS transistor 122 with its channel area formed in a recrystallized active element area and its cell capacitor is formed in an inactive area containing single crystalline silicon, single layer polysilicon serving as its cell plate.

A memory element according to another embodiment of the present invention is described by way of its mask pattern in FIG. 11A and its cross-sectional structure in FIG. 11B wherein numeral 131 indicates a recrystallized active element area, numerals 132 and 133 indicate inactive areas, numeral 134 indicates an insulative area, numeral 135 indicates single crystalline silicon, numeral 136 indicates a word line, numeral 137 indicates a bit line, and numerals 138 and 139 indicate polysilicon. The memory element depicted in FIGS. 11A and 11B, like the one shown in FIGS. 10A and 10B, has a MOS transistor 140 formed in a recrystallized active element area and a cell capacitor in an inactive area. The memory cell shown in FIGS. 11A and 11B is different in that the cell capacitor 141 shown in FIG. 11B is formed with double-layered polysilicon rather than by using single crystalline silicon in an inactive area. Like the memory cell of FIGS. 10A and 10B, however, the memory cell of FIGS. 11A and 11B does not have its active elements such as transistors placed in its inactive areas but makes use of such inactive areas, for example, for forming a cell capacitor. As a practical matter, however, single crystalline silicon is removed from the inactive areas where crystalline granular interfaces are expected to be present, creating separation areas as shown in FIG. 11B.

FIGS. 12A and 12B show a logical circuit element embodying the present invention. FIG. 12B is a conceptual diagram of an inverter element and FIG. 12A is its mask pattern when it is formed with two active layers. With reference to FIGS. 12A and 12B, numerals 151 and 152 indicate active layers, numerals 153 and 154 indicate recrystallized active element areas, numerals 155, 156, 157 and 158 are inactive areas, numeral 159 indicates a gate input, each numeral 160 indicates an output terminal, numeral 161 indicates a first power source and numeral 162 indicates a second power source. If the active layer 151 is formed as a PMOS transistor of SOI structure, the other active layer 152 is an NMOS transistor of SOI structure, or they may be reversed. If the active layer 151 is PMOS and the other active layer 152 is NMOS, this is a CMOS inverter element with its input/output terminals connected by throughholes 163 and 164, the first power source of the active layer 151 corresponds to the source voltage $V_C$ of the element and the second power source of the active layer 152 corresponds to the ground potential. As shown in FIG. 12A, the channel area of the MOS transistor is formed in a recrystallized active element area and inactive areas thought to contain crystalline granular interfaces are utilized for wiring and throughholes. Although not illustrated, metal contacts to gate polysilicon and single silicon drains and sources of transistors may be placed in inactive areas. Other transistor elements may be similarly formed therein.

In summary, three-dimensionally structured semiconductor IC elements embodying this aspect of the present invention are characterized as having active layers comprised of recrystallized active element areas with desired widths, inactive areas and separation areas with desired intervals which insulate them. In addition, it has channel areas of MOS transistors formed in recrystallized active element areas to improve the element reliability, while inactive areas are utilized for placing capacitors, throughholes, contact pieces and the like. This allows the degree of integration to be improved without increasing the area of the element.

The foregoing description of preferred embodiments of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention.

What is claimed is:

1. A semiconductor dynamic memory device of three-dimensionally stacked structure comprising
    a first active layer which is flat and is formed on a single crystalline silicon substrate,
    a second active layer which is flat and is obtained by melting polycrystalline silicon by irradiation on an insulative layer which electrically insulates said first active layer from said second active layer, and
    throughholes connecting said active layers across said insulative layer,
    each of said active layers comprising single crystalline active element areas which serve to have transistors formed therein, separation areas which individually insulate said active element areas and passive element areas which serve to have plane capacitors, said active element areas and said separation areas having selected widths, PMOS, NMOS or CMOS field effect transistors being formed in said active element areas of each of said active layers, plane capacitors being formed in said passive element areas of each of said active layers, each of said transistors in said first active layer being connected to one of said plane capacitors in said second active layer through one of said throughholes and each of said transistors in said second active layer being connected to one of said plane capacitors in said first active layer through another of said throughholes.

2. The semiconductor dynamic memory device of claim 1 wherein said first active layer is of SOI structure obtained by melting polycrystalline silicon by irradiation on another insulative layer on said substrate.

3. The semiconductor dynamic memory device of claim 1 further comprising a redundant circuit section contained in said first active layer and/or said second active layer.

4. The semiconductor dynamic memory device of claim 1 further comprising a test circuit for testing the functions originally intended for said active elements, and redundant circuits for said test circuit, said test circuit and said redundant circuits being contained in said first active layer or said second active layer.

5. The semiconductor dynamic memory device of claim 1 wherein said active layers are stacked one on top of another and said element comprises throughholes which connect said layers in perpendicular direction.

* * * * *